United States Patent
Chan et al.

(10) Patent No.: US 8,179,037 B2
(45) Date of Patent: May 15, 2012

(54) HIGH POWER LED MODULE ASSEMBLY AND METHOD FOR MANUFACTURING THE SAME

(75) Inventors: Chi Man Chan, Hong Kong (CN); Xi Yuan He, Guangdong (CN); Chin You Yue, Hong Kong (CN); Ze Sheng Ye, Guangdong (CN)

(73) Assignee: Osram AG, Munich (DE)

( * ) Notice: Subject to any disclaimer, the term of this patent is extended or adjusted under 35 U.S.C. 154(b) by 0 days.

(21) Appl. No.: 12/650,575

(22) Filed: Dec. 31, 2009

(65) Prior Publication Data
US 2010/0171405 A1 Jul. 8, 2010

(30) Foreign Application Priority Data
Jan. 6, 2009 (CN) .......................... 2009 1 0000360

(51) Int. Cl.
*H01J 1/62* (2006.01)
*F21S 4/00* (2006.01)
*H01L 33/00* (2010.01)
(52) U.S. Cl. ...................... 313/506; 362/249.02; 257/98; 257/99
(58) Field of Classification Search .................. 313/506, 313/512; 257/79, 98, 99, 100, 433, 434; 362/294, 249.01, 249.02
See application file for complete search history.

(56) References Cited

U.S. PATENT DOCUMENTS

| 2007/0114562 A1* | 5/2007 | Radkov et al. ............... 257/103 |
| 2007/0285927 A1 | 12/2007 | Chen |
| 2008/0087911 A1 | 4/2008 | Stoyan |

FOREIGN PATENT DOCUMENTS

| DE | 202006013052 U1 | 3/2007 |
| DE | 102006048230 A1 | 4/2008 |
| WO | 2007131123 A2 | 11/2007 |

OTHER PUBLICATIONS

The European Search Report mailed Jun. 17, 2010.

\* cited by examiner

*Primary Examiner* — Bumsuk Won

(57) ABSTRACT

A high power LED module assembly may include at least one high power LED module each of which includes a MCPCB and a high power LED disposed on the MCPCB, a flex tube which includes a base engaging with each of the high power LED modules and a cover enclosing the base; wherein the high power LED module assembly further comprises at least one heat sink each of which is correspondingly connected to the bottom of each high power LED modules; and wherein the cover is engaged with the heat sink and encloses the base, the high power LED module and all other sides of the heat sink than the bottom side thereof which is exposed to ambient environment.

12 Claims, 5 Drawing Sheets

HIGH POWER LED MODULE ASSEMBLY AND METHOD FOR MANUFACTURING THE SAME

CROSS-REFERENCE TO RELATED APPLICATION

This application claims priority to Chinese Patent Application Serial No. 200910000360.0, which was filed Jan. 6, 2009, and is incorporated herein by reference in its entirety.

TECHNICAL FIELD

Various embodiments relate to a LED lighting device, e.g. to high power LED module assembly including a flex tube and the method for manufacturing the assembly.

BACKGROUND

Currently, LED light is becoming more and more popular. As is well known, for the LED modules in prior art, especially those low power LED modules (0.1-0.5 W), a certain technical solution is employed such that the module is enclosed in a flex plastic tube to obtain waterproof function. However, due to the property of plastic material itself, this technical solution is not suitable for those high power LED modules (>0.5 W) to provide sound effects in heat dissipation. Therefore, the life of those high power LED modules will suffer severely, and also stable light output can not be ensured.

In traditional LED enclosing structures, those electronic components outside and inside after being connected with wires are commonly enclosed with epoxy resin, thermal resistance of which can be up to 250-300 □/W. If the high power chip is enclosed using the traditional LED enclosing structures, the junction temperature of the chip will increase rapidly and the epoxy resin will become carbonized and turn into yellow, thereby accelerating the deterioration of the electronic components until they cease to work. Even failure of the electronic components can be caused by open circuit created under the effect of thermal stress generated due to rapid thermal expansion.

In view of the above, for those high power LED modules, it is preferable that a enclosing structure which has the function of both waterproof and sound heat dissipation can be employed.

SUMMARY

According to various embodiments, a high power LED module assembly is provided, which includes at least one high power LED module each of which includes a MCPCB and a high power LED disposed on the MCPCB, a flex tube which includes a base engaging with each of the high power LED modules and a cover enclosing the base. The high power LED module assembly also includes at least one heat sink each of which is correspondingly connected to the bottom of each high power LED modules, and the cover is engaged with the heat sink and encloses the base, the high power LED module and all other sides of the heat sink than the bottom side thereof which is exposed to ambient environment.

According to various embodiments, a method for making the above high power LED module assembly is provided, which may include: (a) making a base by extrusion process and punching at least one holes in the base; (b) inserting at least one high power LED module each of which includes a MCPCB and a high power LED and at least one heat sink into the holes upwardly and downwardly respectively and fixing them together via screws; (c) enclosing the base as well as the high power LED module and the heat sink fixed therewith a cover formed by extrusion process such that, except for the bottom of the heat sink exposed to ambient environment, the base, the high power LED module and other portions of the heat sink are enclosed by and hermetically engaged with the cover.

The high power LED module assembly according to various embodiments is provided with a flex tube which encloses the base, the high power LED module and some sides of the heat sink and at the same time let the bottom side of the heat sink exposed to ambient environment. As such, not only the high power LED module assembly of the various embodiments is made have sound waterproof function, but also full heat dissipation of the high power LED module assembly can be realized by the heat sink, and at the same time the high power LED module assembly has sound flexibility.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

Various embodiments provide a high power LED module assembly including an improved enclosing structure and the method for making the same, wherein the enclosing structure provides the high power LED module assembly with not only sound waterproof function but also excellent heat dissipating capacity.

Figure 1:
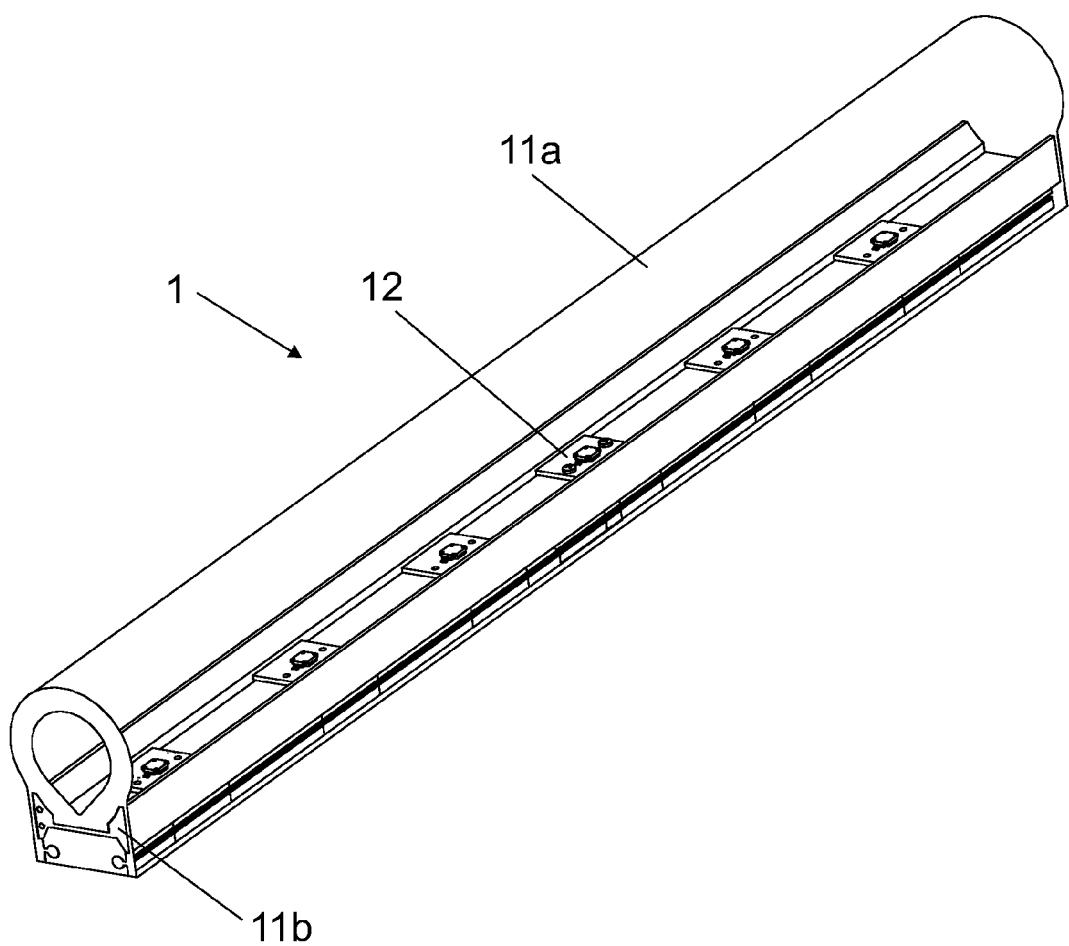
FIG. 1 shows a schematically perspective view showing the LED module assembly according to various embodiments.
Figure 2:
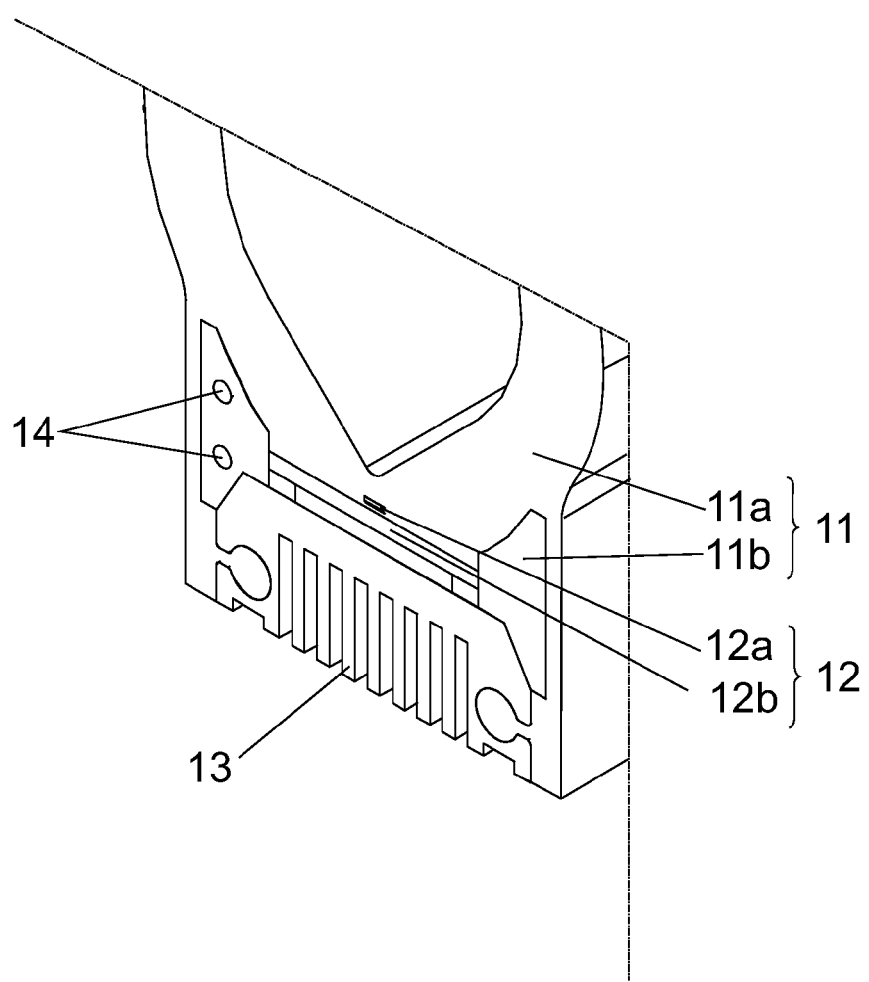
FIG. 2 shows a partially sectional view of the LED module assembly shown in FIG. 1.

As shown in FIG. 1 and FIG. 2, the high power LED module assembly according to an exemplary embodiment is generally indicated with 1. The high power LED module assembly 1 may include at least one high power LED module 12 which includes a MCPCB (i.e., metal core printed circuit board) 12b and a high power LED 12a disposed on the MCPCB 12b, a flex tube 11 which includes a base 11b engaging with the high power LED module 12 and a cover 11a partially enclosing the base 11b, and at least one heat sink 13, one of which is correspondingly arranged beneath each high power LED module 12. In the high power LED module assembly of various embodiments, the cover 11a is made by extrusion process such that the base 11b, the high power LED module 12 and part of the heat sink 13 are enclosed by and hermetically engaged with the cover 11a, except that the bottom of the heat sink 13 is exposed to ambient environment.

Since the cover 11a is made by extrusion process and also the base 11b, the high power LED module 12 and part of the heat sink 13 are enclosed by and hermetically engaged with the cover 11a except that the bottom of the heat sink 13 is exposed to ambient environment, on one hand, the high power LED module assembly of various embodiments has an integral outer contour so that entrance of water into the inside of the module assembly can be effectively prevented; on the other hand, under the circumstance that the heat sink 13 with its bottom exposed to ambient environment is directly connected with the LED module 12, the heat generated by the LED module 12 can be effectively dissipated, thereby stabilizing the property of the LED module and extending its service life.

Figure 3:
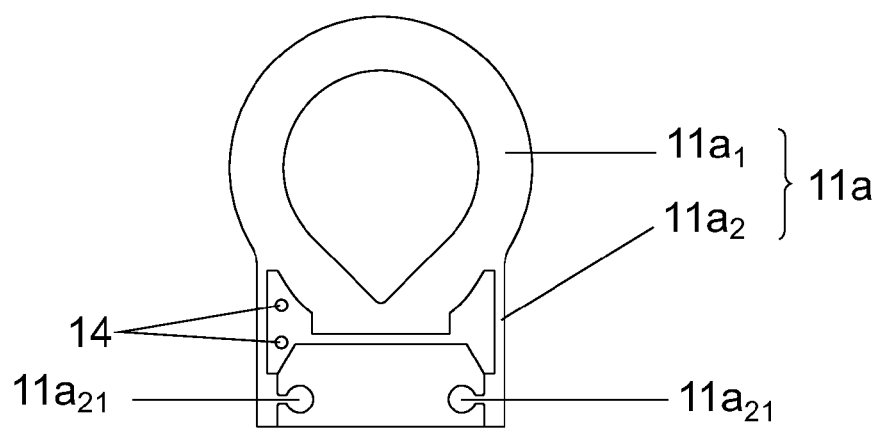
FIG. 3 shows a schematically sectional view of the LED module assembly shown in FIG. 1.
Figure 4:
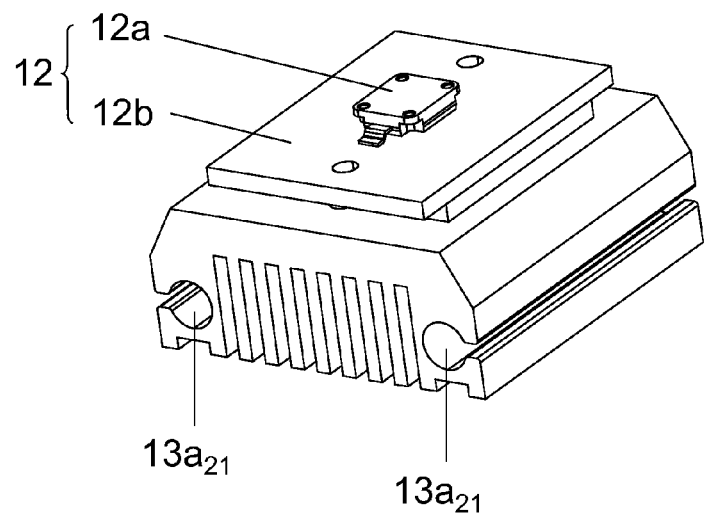
FIG. 4 shows a perspective view showing the LED module and the heat sink of the LED module assembly in FIG. 1.

As shown in FIG. 3, the cover 11a includes a tubular portion $11a_1$ and two side portions $11a_2$ integrally extending downward from the tubular portion $11a_1$. Each of the two side portions $11a_2$ of the cover 11a is formed with a lug $11a_{21}$ at its inside which projects inwardly, and the heat sink 13 is correspondingly formed with a groove $13a_{21}$ on each of its outside which mates with the lug $11a_{21}$ in shape. In various embodiments, the sectional shape of the lug $11a_{21}$ is similar to the shape of a table tennis bat positioned horizontally. In fact, in the manufacturing process according to various embodiments, the groove $13a_{21}$ is formed prior to the formation of the lug $11a_{21}$, particularly, the lug $11a_{21}$ is formed by extrusion process into a shape which mates with that of the groove $13a_{21}$ which will be described in detail hereinafter. This configuration is useful in preventing entrance of water into the inside of the LED module assembly from the joint portion of the side portions $11a_2$ of the cover 11a and the two outside portions of the heat sink 13, thereby enhancing the waterproof property of the high power LED module assembly of various embodiments.

It should be noted that various embodiments are shown in the figures merely by way of examples and the shapes and/or sizes of the tubular portion $11a_1$ and the side portions $11a_2$ may be adjusted depending on specific applications, provided that an integral contour thereof can be obtained by means of extrusion process thereby improving the waterproof property. Further, each of the side portions $11a_2$ of the cover 11a may be formed with more than one lug $11a_{21}$ at its inside, and the lug $11a_{21}$ can be formed in any other suitable shapes so long as entrance of water into the inside of the LED module assembly from the joint portion of the side portions $11a_2$ of the cover 11a and the two outside portions of the heat sink 13 can be prevented. In addition, the lug may be provided at each of the two outside portions of the heat sink 13 while the groove is provided at the inside of the cover 11a.

In the LED module assembly of the present invention, the base 11b is also made by extrusion process. And as shown in FIG. 3, the base 11b has two side portions substantially extending in vertical direction and a middle portion extending horizontally, such that the sectional shape of the base 11b is similar to the shape of the word "I" positioned horizontally. Moreover, one of the two side portions of the base 11b shown in FIG. 3 is provided with a bus circuit 14 which functions to electrically connect the high power LED module 12. It should be noted that although the bus circuit is shown in the left side portion of the base 11b, the bus circuit 14 may be provided in the right side portion of the base 11b or in both right and left side portions thereof, provided that no negative affection on the electrical connection of the high power LED module 12 will be caused.

Figure 5:
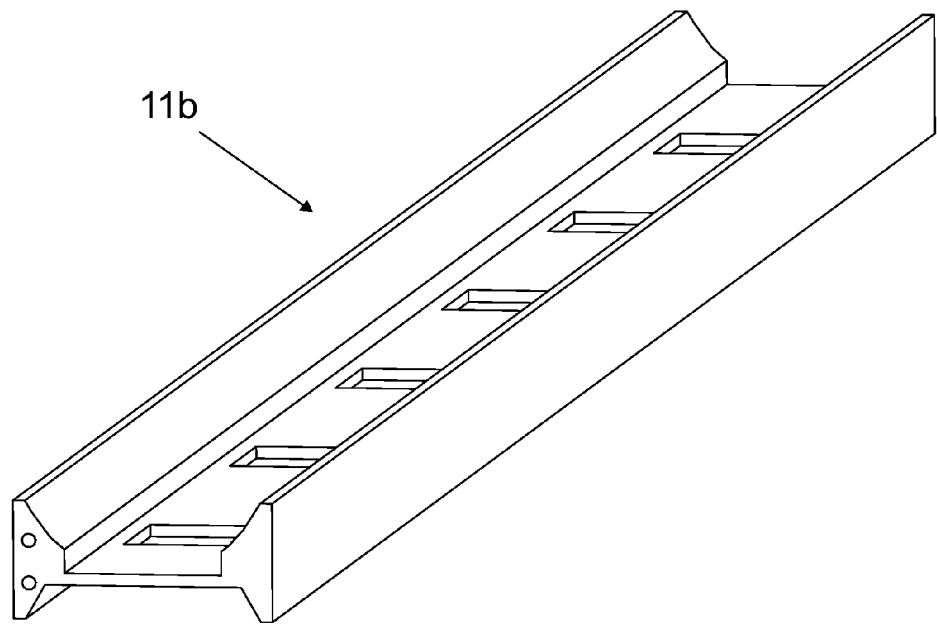
FIG. 5 shows a schematically perspective view showing the base of the LED module assembly in FIG. 1, wherein several holes have been punched in the base.
Figure 6A:
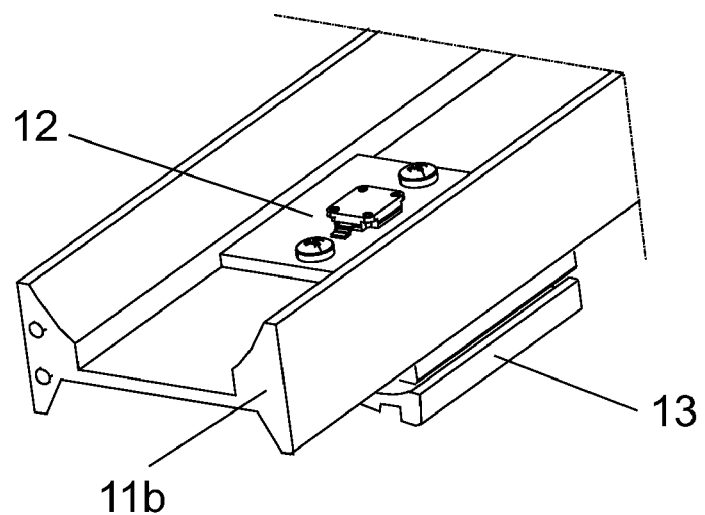
FIG. 6A shows a perspective view showing the state in which the LED module and the heat sink of FIG. 4 and the base of FIG. 5 are assembled with each other.
Figure 6B:
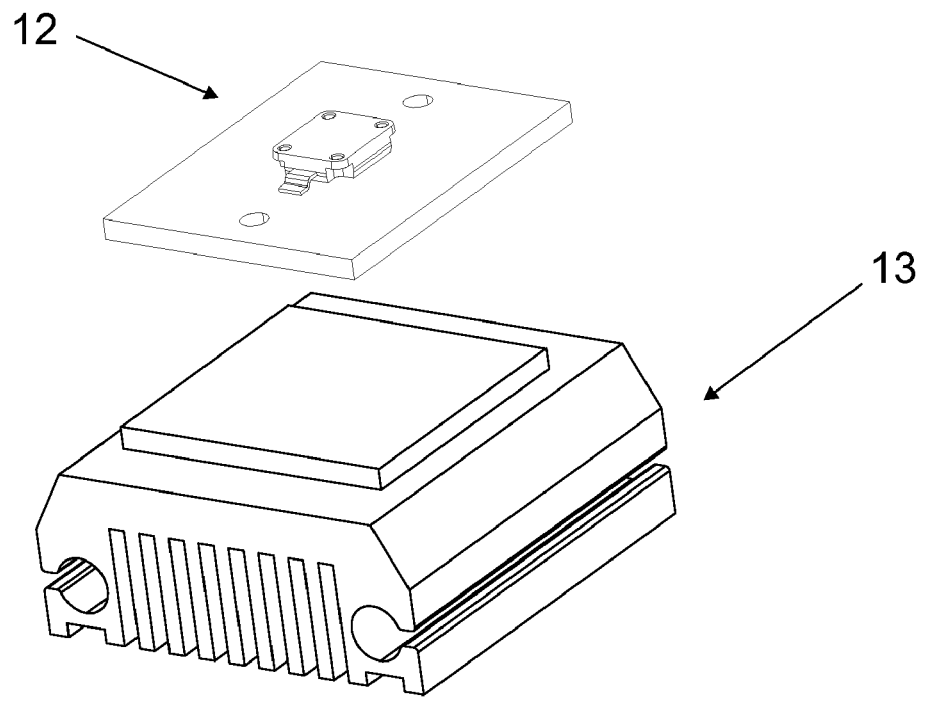
FIG. 6B shows a perspective view showing the positional relationship of the LED module and the heat sink of FIG. 4 during assembly process.
Figure 7:
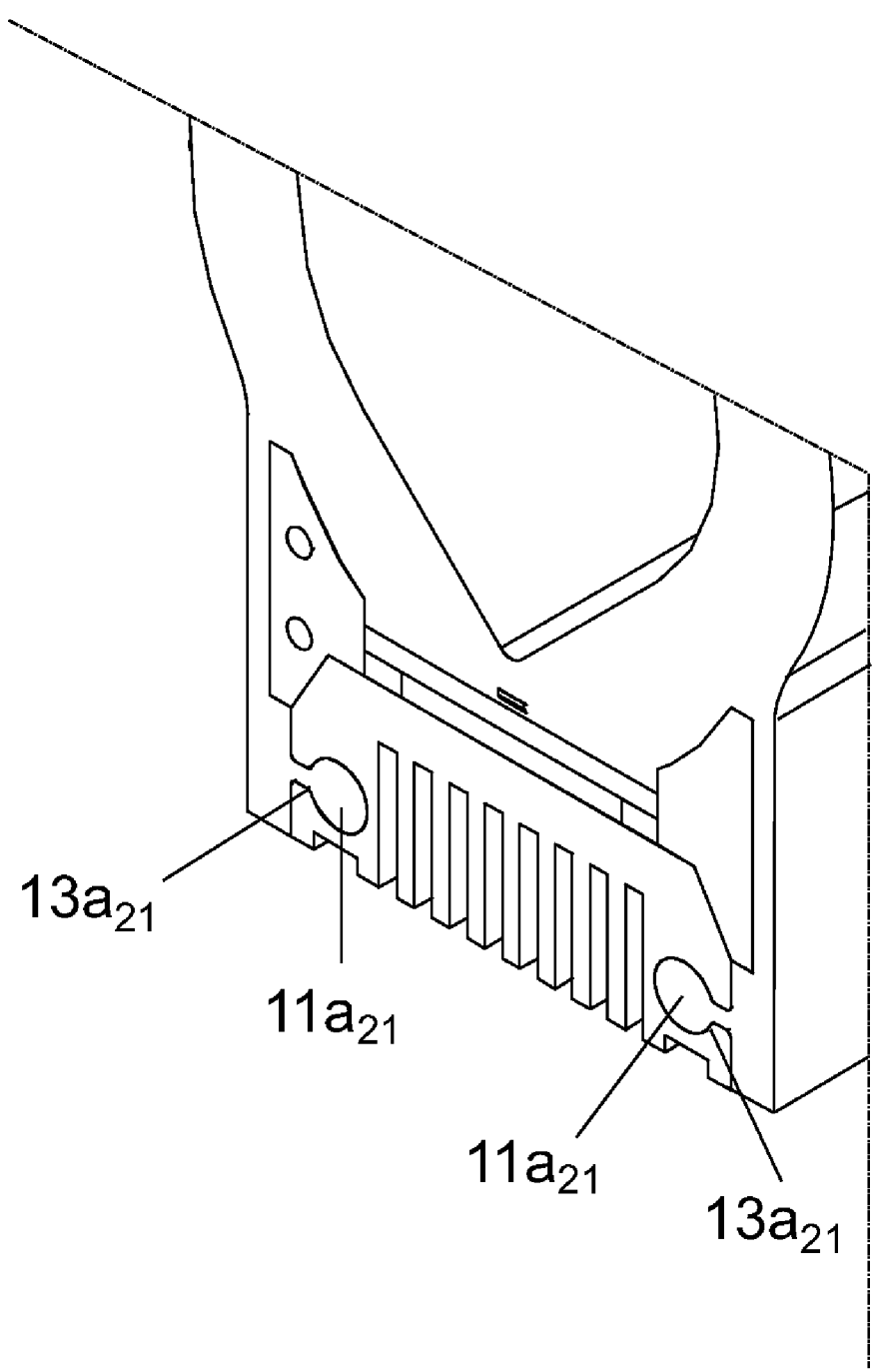
FIG. 7 shows a partially enlarged view showing the LED module assembly of the various embodiments after being enclosed by the cover.

Further, as shown in FIG. 5, the base 11b is formed with at least one thorough hole at its middle portion, and the high power LED module 12 and the heat sink 13 are respectively inserted into the through holes either upwardly or downwardly such that the high power LED module 12 may be in direct contact with the heat sink 13 so as to enhance the capacity of heat dissipation. Although only six holes are shown in the figure, the number of the holes may be adjusted depending on specific applications. Yet in any case, the number of the holes should correspond to the number of the high power LED module 12 and the heat sink 13.

In the high power LED module assembly of the present invention, the base 11b and/or the cover 11a are typically made of plastic materials, e.g. PVC (Polyvinyl Chloride) which has optical functions, such as the function of diffusing the light emitted by the high power LED module 12. The heat sink 13 may be made of metal, e.g. aluminum. The heat sink 13 may be formed into the shape of thin sheets, for example the cooling fin with a plurality of fins shown in the figures, so as to increase the area of the heat dissipating surface.

And also, in the high power LED module assembly of various embodiments, the high power LED module 12, the heat sink 13 and the base 11b are connected with each other via screws. It should be noted that the high power LED module 12, the heat sink 13 and the base 11b may be connected with each other in any other forms, provided that the heat generated by the high power LED module 12 can be fully and effectively transmitted to the heat sink 13. For example, the heat sink 13 may firstly be connected to the high power LED module 12 via screws, and then the high power LED module 12 may be connected to the base 11b at the MCPCB 12b so that the high power LED module 12, the heat sink 13 and the base 11b are fixedly connected with each other. Alternatively, the high power LED module 12 and the heat sink 13 may be respectively connected to the base 11b via screws, provided that sound heat transmission can be ensured. Of course, those connectors or connecting means other than screws may be employed, such as bonding.

In the high power LED module assembly of the present invention, the path of heat transmission is as follows: the LED 12a (heat emitting member)→the MCPCB 12b (heat transmitting member)→the heat sink 13.

Further, various embodiments also relate to a flex tube 11 used in the high power LED module assembly 1 described above. The flex tube 11 includes a base 11b engaging with the high power LED module 12 and a cover 11a partially enclosing the base 11b, and the cover 11a is made by extrusion process such that, except for the bottom of the heat sink 13 exposed to ambient environment, the base 11b, the high power LED module 12 and other portions of the heat sink 13 are enclosed by and hermetically engaged with the cover 11a, thereby not only enhancing the waterproof property of the LED module assembly but also improving the heat dissipating function thereof.

Furthermore, various embodiments also relates to the cover 11a included in the above flex tube 11. As described above, the cover 11a is made by extrusion process such that, except for the bottom of the heat sink 13 exposed to ambient environment, the base 11b, the high power LED module 12 and other portions of the heat sink 13 are enclosed by and hermetically engaged with the cover 11a, thereby not only enhancing the waterproof property of the LED module assembly but also improving the heat dissipating function thereof.

Various embodiments also provide a method for making the high power LED module assembly described hereinabove, which may include the following processes:

Firstly, as shown in FIG. 5, a base 11b is made by extrusion process and at least one through holes is punched in the base 11b. The base 11b may have side portions substantially extending in vertical direction and a middle portion extending horizontally, and the number of the holes corresponds to the number of the high power LED modules and the heat sinks. At the same time, a bus circuit 14 is simultaneously formed inside one of the two side portions of the base 11b depending on specific applications.

Secondly, at least one high power LED module 12 each of which includes an MCPCB 12b and a high power LED 12a and at least one heat sink 13 are inserted into the holes upwardly or downwardly and fixed with each other via screws. As described above, the high power LED module 12, the heat sink 13 and the base 11b may be connected and fixed with each other in any other forms, provided that the heat generated by the high power LED module 12 can be fully and effectively transmitted to the heat sink 13.

Finally, the cover 11a is formed by extrusion process so as to enclose the base 11b as well as the high power LED module 12 and the heat sink 13 fixed therewith, such that, except for the bottom of the heat sink 13 exposed to ambient environment, the base 11b, the high power LED module 12 and other portions of the heat sink 13 are enclosed by and hermetically engaged with the cover 11a.

In this way, the assembly of the high power LED module assembly of various embodiments is completed, which not only has sound waterproof function but also has excellent heat dissipating property, thereby possessing more stable working property and longer service life.

In conclusion, the high power LED module assembly according to various embodiments may present the following advantages: firstly, the waterproof function and heat dissipating property of the high power LED module 12 is enhanced; secondly, the flexibility of the high power LED module assembly 1 is increased by provision of the base 11b and the cover 11a made of PVC; finally, the high power LED module assembly of the present invention is easy to make and assemble at low cost.

Although the various embodiments are described for those high power LED modules, it can be applied to the low power LED modules, i.e., the LED modules with power lower than 0.5 W. In addition, while the exemplary embodiment of the high power LED module assembly 1 has been described hereinabove, it can be appreciated that other modifications and variations of the high power LED module assembly can be easily made by those skilled in the art, which shall fall within the scope of the invention, without departing from the spirit and the scope of the invention.

Various embodiments solve at least some of the abovementioned problems existing in prior art.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A high power LED module assembly, comprising:
   at least one high power LED module each of which includes a MCPCB and a high power LED disposed on the MCPCB,
   a base engaging with each of the high power LED modules and
   a flex tube including:
   a cover enclosing the base, the cover including:
      a diffuser portion having an annular cross section;
      two side portions integrally extending downward from the diffuser portion;
   at least one heat sink each of which is correspondingly connected to a side of each of said high power LED modules; and
   wherein the cover hermetically encloses the high power LED modules, at least one side of said heat sink being environmentally exposed outside of said hermetic enclosure.

2. The high power LED module assembly as claimed in claim 1, wherein the cover comprises a tubular portion and two side portions integrally extending downward from the tubular portion, each of the two side portions of the cover being formed with at least one lug at its inside which projects inwardly; and wherein the heat sink is correspondingly formed on each of its outer sides with at least one groove which mates with the lug in shape, the at least one lug cooperating with the at least one groove so as to achieve engagement of the cover and the heat sink.

3. The high power LED module assembly as claimed in claim 2, wherein the sectional shape of the lug is similar to the shape of a table tennis bat positioned horizontally.

4. The high power LED module assembly as claimed in claim 1, wherein the base has two side portions substantially extending in vertical direction and a middle portion extending horizontally, such that the sectional shape of the base is similar to the shape of a letter "I".

5. The high power LED module assembly as claimed in claim 4, wherein one of the two side portions of the base is provided with a bus circuit which functions to electrically connect the high power LED module.

6. The high power LED module assembly as claimed in claim 4, wherein the base is formed with at least one hole at its middle portion, and the high power LED module and the heat sink are in direct contact with each other through the at least one hole.

7. The high power LED module assembly as claimed in claim 1, wherein at least one of the base and the cover are made of PVC.

8. The high power LED module assembly as claimed in claim 1, wherein the heat sink is made of aluminum.

9. The high power LED module assembly as claimed in claim 1, wherein the heat sink has a plurality of cooling fins.

10. The high power LED module assembly as claimed in claim 1, wherein the high power LED module, the heat sink and the base are connected with each other via screws.

11. A method for manufacturing a high power LED module assembly, the method comprising:
    manufacturing a base by extrusion process and punching at least one holes in the base;
    manufacturing a cover formed by extrusion process with a diffuser portion having an annular cross section and two side portions integrally extending downward from the diffuser,
    inserting at least one high power LED module each of which includes a MCPCB and a high power LED and at least one heat sink into the holes upwardly and downwardly respectively and fixing them together via screws; and enclosing the base as well as the high power LED module and the heat sink fixed therewith with the cover formed by-extrusion process such that, except the bottom of the heat sink exposed to ambient environment, the base, the high power LED module and other portions of the heat sink are enclosed by and hermetically engaged with the cover.

12. A method for manufacturing a high power LED module assembly, the high power LED module assembly comprising: at least one high power LED module each of which includes a MCPCB and a high power LED disposed on the MCPCB, a base engaging with each of the high power LED modules and a flex tube which includes a cover enclosing the base, the cover including a diffuser portion having an annular cross section and two side portions integrally extending downward from the diffuser; wherein the high power LED module assembly further comprises at least one heat sink each of which is correspondingly connected to the bottom of each high power LED modules; and wherein the cover hermetically encloses the high power LED modules, at least one side of the heat sink being environmentally exposed outside of said hermetic enclosure, the method comprising: manufacturing a base by extrusion process and punching at least one holes in the base; inserting at least one high power LED module each of which includes a MCPCB and a high power LED and at least one heat sink into the holes upwardly and downwardly respectively and fixing them together via screws; and enclosing the base as well as the high power LED module and the heat sink fixed therewith a cover formed by extrusion process such that, except the bottom of the heat sink exposed to ambient environment, the base, the high power LED module and other portions of the heat sink are enclosed by and hermetically engaged with the cover.

* * * * *